United States Patent
Hsu (10) Patent No.: US 7,084,792 B2
(45) Date of Patent: Aug. 1, 2006

(54) CIRCUIT FOR ZERO OFFSET AUTO-CALIBRATION AND METHOD THEREOF

(75) Inventor: Po-Chin Hsu, Hsinchu (TW)

(73) Assignee: Sunplus Technology Co., Ltd., Hsinchu (TW)

( * ) Notice: Subject to any disclaimer, the term of this patent is extended or adjusted under 35 U.S.C. 154(b) by 0 days.

(21) Appl. No.: 11/161,172

(22) Filed: Jul. 26, 2005

(65) Prior Publication Data

US 2006/0109151 A1    May 25, 2006

(30) Foreign Application Priority Data

Nov. 25, 2004   (TW) ............................ 93136264 A (51) Int. Cl.
*H03M 1/06* (2006.01)
(52) U.S. Cl. .................. 341/118; 341/120; 341/161
(58) Field of Classification Search ............... 341/118, 341/120, 122, 155, 161, 172
See application file for complete search history.

(56) References Cited

U.S. PATENT DOCUMENTS

| | | | |
|---|---|---|---|
| 5,635,937 A * | 6/1997 | Lim et al. ................ 341/161 |
| 5,874,909 A | 2/1999 | Soenen et al. ............ 341/141 |
| 6,353,405 B1 | 3/2002 | Yang et al. ............... 341/155 |
| 6,373,424 B1 * | 4/2002 | Soenen ..................... 341/161 |
| 6,489,904 B1 * | 12/2002 | Hisano ...................... 341/120 |
| 6,606,042 B1 * | 8/2003 | Sonkusale et al. ........ 341/120 |
| 6,822,601 B1 * | 11/2004 | Liu et al. .................. 341/161 |
| 6,882,292 B1 * | 4/2005 | Bardsley et al. ........... 341/121 |
| 6,967,603 B1 * | 11/2005 | Lin ............................. 341/120 |
| 6,977,605 B1 * | 12/2005 | Lee et al. .................. 341/161 |

* cited by examiner

*Primary Examiner*—Linh Nguyen
(74) *Attorney, Agent, or Firm*—Jianq Chyun IP Office (57) ABSTRACT

A circuit for zero offset auto-calibration and a method thereof suitable for video signal analog-to-digital converters are provided. The circuit is connected between the last stage of a pipeline analog-to-digital converter (the pipeline ADC) and a differential signal buffer, comprised of an indicator signal generator, a calibration voltage generator and a timing controller. The indicator signal generator outputs an indicator signal to indicate whether the output from the pipeline ADC is too high or too low. The calibration voltage generator provides the differential signal buffer with a calibration voltage and, within a calibration period determined by a delay signal, regulates the calibration voltage in response to the indicator signal. The timing controller outputs the delay signal to control the length of the calibration period, so that the compensation speed of the pipeline ADC is less than its converting delay speed, and the compensation loop gets stable.

20 Claims, 5 Drawing Sheets

CIRCUIT FOR ZERO OFFSET AUTO-CALIBRATION AND METHOD THEREOF

CROSS-REFERENCE TO RELATED APPLICATION

This application claims the priority benefit of Taiwan application serial no. 93136264, filed on Nov. 25, 2004. All disclosure of the Taiwan application is incorporated herein by reference.

BACKGROUND OF THE INVENTION

1. Field of Invention

The present invention relates to a circuit for zero offset auto-calibration and the method thereof. More particularly, the present invention relates to a circuit for zero offset auto-calibration and the method thereof suitable for an analog-to-digital converting circuit for video signals.

2. Description of the Prior Art

In recent years, digital circuits/devices dealing with video signal always include a analog-to-digital converter (ADC). But the ADC usually has zero offset problem. The so-called zero offset means that there is a DC offset on the signal converting path of ADC, and makes the output not zero under an input of blanking signal. In such a case, the zero offset must be compensated to correct the output.

The attempts to solve the problem have been made before with unsatisfactory results. In the U.S. Pat. No. 5,874,909, a circuit of analog-to-digital converting with a function of auto compensating errors was presented, whereby a calibration digital code, based on digital signal processing, was fed back and converted into an analog signal via a digital-to-analog converter (DAC) to compensate the input signal. As the shortcoming with the means, an additional digital-to-analog converter (DAC) is needed. Besides, the resolution of DAC needs to be enhanced in order to increase the compensation accuracy.

In the U.S. Pat. No. 6,353,405, another kind of analog-to-digital video converter was presented based on a similar principle. A DAC is required as a calibration signal generator, and therefore the same shortcoming to require an additional DAC and expanded area still exists along with an increasing compensation resolution. Besides, a register is also required to hold calibration data.

Thus it can be seen that a better technology needs to be developed to solve the zero offset problem without the shortcomings of the prior art.

SUMMARY OF THE INVENTION

It is an object of the present invention to provide a circuit for zero offset auto-calibration to solve the problem of zero offset. The advantage therewith is the digital-to-analog converter (DAC) and the register required by the prior art are saved, and what needed are such simple circuits, a logic circuit, a timing control circuit and a charging/discharging circuit. Consequently, the circuit layout can be simplified with an area saving.

The another object of the invention is to provide a method of zero offset auto-calibration to solve the problem of zero offset. The advantage therewith is, a complex computation code is not needed anymore, instead, the required signal to indicate compensation direction can be synthesized via simple operation steps only.

To reach the above-mentioned objects and the others, the present invention proposes a circuit of zero offset auto-calibration connected between the last stage of a pipeline analog-to-digital converter (pipeline ADC) and a differential signal buffer. The circuit comprises an indicator signal generator, a calibration voltage generator and a timing controller. The indicator signal generator is connected with the above-mentioned last stage and outputs an indicator signal to indicate whether the output from the pipeline ADC is too high or too low in response to the output from the comparator array contained in the last stage. The calibration voltage generator is connected between the indicator signal generator and the differential signal buffer, outputs a calibration voltage to the differential signal buffer, and adjusts the calibration voltage itself according to the indicator signal within a calibration period determined by a delay signal. The timing controller is connected with the calibration voltage generator, outputs an above-mentioned delay signal to control the length of the calibration period so that the compensation speed of the pipeline ADC is less than its converting delay speed.

In the above-mentioned circuit from one of the embodiments of the present invention, the indicator signal generator generates and outputs an indicator signal in response to the outputs from X comparators of the comparator array nearest to a bottom reference voltage, wherein X is a positive integer greater than or equal to 2.

In the above-mentioned circuit from one of the embodiments of the present invention, the indicator signal generator maps all possible combinations of outputs of the comparators onto 2× binary numbers. The mapping is a one-to-one relationship. The bigger the binary number, the higher the corresponding input voltage of the last stage. The indicator signal generator outputs an indicator signal indicating that the output from the pipeline ADC is too high when the combination of the outputs from the comparators corresponds to one of the Y biggest binary numbers of the binary numbers mentioned above. And, the indicator signal generator outputs an indicator signal indicating that the output from the pipeline ADC is too low when the combination of the outputs from the comparators corresponds to one of the Z smallest binary numbers of the binary numbers mentioned above. Wherein both of Y and Z are positive integers, and Y+Z<2×.

In the above-mentioned circuit from one of the embodiments of the present invention, X is equal to 2, Y is equal to 1, and Z is equal to 1.

In the above-mentioned circuit from one of the embodiments of the present invention, the calibration voltage generator receives also a clamp signal, and the above-mentioned calibration period is determined by the delay signal and the clamp signal together.

In the above-mentioned circuit from one of the embodiments of the present invention, the calibration period is the period when both of the delay signal and the clamp signal are in a logic high voltage.

In the above-mentioned circuit from one of the embodiments of the present invention, in response to an indicator signal indicating that the output from the pipeline ADC is too high the calibration voltage generator will reduce it's the calibration voltage. In response to an indicator signal indicating that the output from the pipeline ADC is too low the calibration voltage generator will increase the calibration voltage.

In another point of view, the present invention proposes also a method for zero offset auto-calibration applicable to an analog-to-digital converting circuit for video signals. The analog-to-digital converting circuit includes a pipeline analog-to-digital converter and a differential signal buffer. The method for zero offset auto-calibration comprises the following steps: Firstly, generating an indicator signal to indicate whether the output from the pipeline ADC is too high or too low in response to the output from the comparator array contained in the last stage of the pipeline ADC. And secondly, providing a calibration voltage to the differential signal buffer, and adjusting the calibration voltage according to the indicator signal within a calibration period determined by a delay signal. Wherein the delay signal controls the length of the calibration period so that the compensation speed of the pipeline ADC is less than its converting delay speed.

In the above-mentioned method from one of the embodiments of the present invention, the step of generating the indicator signal can be expressed in further detail that the indicator signal is generated in response to the outputs from X comparators of the comparator array nearest to a bottom reference voltage. Here X is a positive integer greater than or equal to 2.

In the above-mentioned method from one of the embodiments of the present invention, the step of generating the indicator signal according to the outputs from the comparators can be expressed in more detail: all possible combinations of the outputs of the comparators are mapped onto 2x binary numbers. The bigger the binary number, the higher the corresponding input voltage of the last stage. When the combination of the outputs from the comparators corresponds to one of the Y biggest binary numbers, an indicator signal is outputted to indicate that the output from the pipeline ADC is too high. When the combination of the outputs from the comparators corresponds to one of the Z smallest binary numbers, an indicator signal is outputted to indicate that the output from the pipeline ADC is too low. Here both of Y and Z are positive integers, and Y+Z<2x.

In the above-mentioned method from one of the embodiments of the present invention, X is equal to 2, Y is equal to 1, and Z is equal to 1.

In the above-mentioned method from one of the embodiments of the present invention, the length of the calibration period is determined by the delay signal and a clamp signal together.

In the above-mentioned method from one of the embodiments of the present invention, the calibration period is the period when both of the delay signal and the clamp signal are in the logic high voltage.

In the above-mentioned method from one of the embodiments of the present invention, the step of providing and adjusting the calibration voltage can be expressed in more detail: in response to an indicator signal indicating that the output from the pipeline ADC is too high the calibration voltage will be reduced; and in response to an indicator signal indicating that the output from the pipeline ADC is too low the calibration voltage will be increased.

As described in the preferred embodiments of the present invention, the invention adopts a simple logic circuit to generate the indicator signal to point out the compensation direction via simple operation steps, utilizes a simple charging/discharging circuit to maintain and adjust the calibration voltage, and employs a simple timing control circuit to control the calibration period. By such means, the present invention eliminates the digital-to-analog converter and the register adopted by the prior art, simplifies the circuit layout and saves the circuit area.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve for explaining the principles of the invention.

DESCRIPTION OF EMBODIMENTS

To explain the circuit of zero offset auto-calibration provided by the present invention, an embodiment is described in the following.

Figure 1:
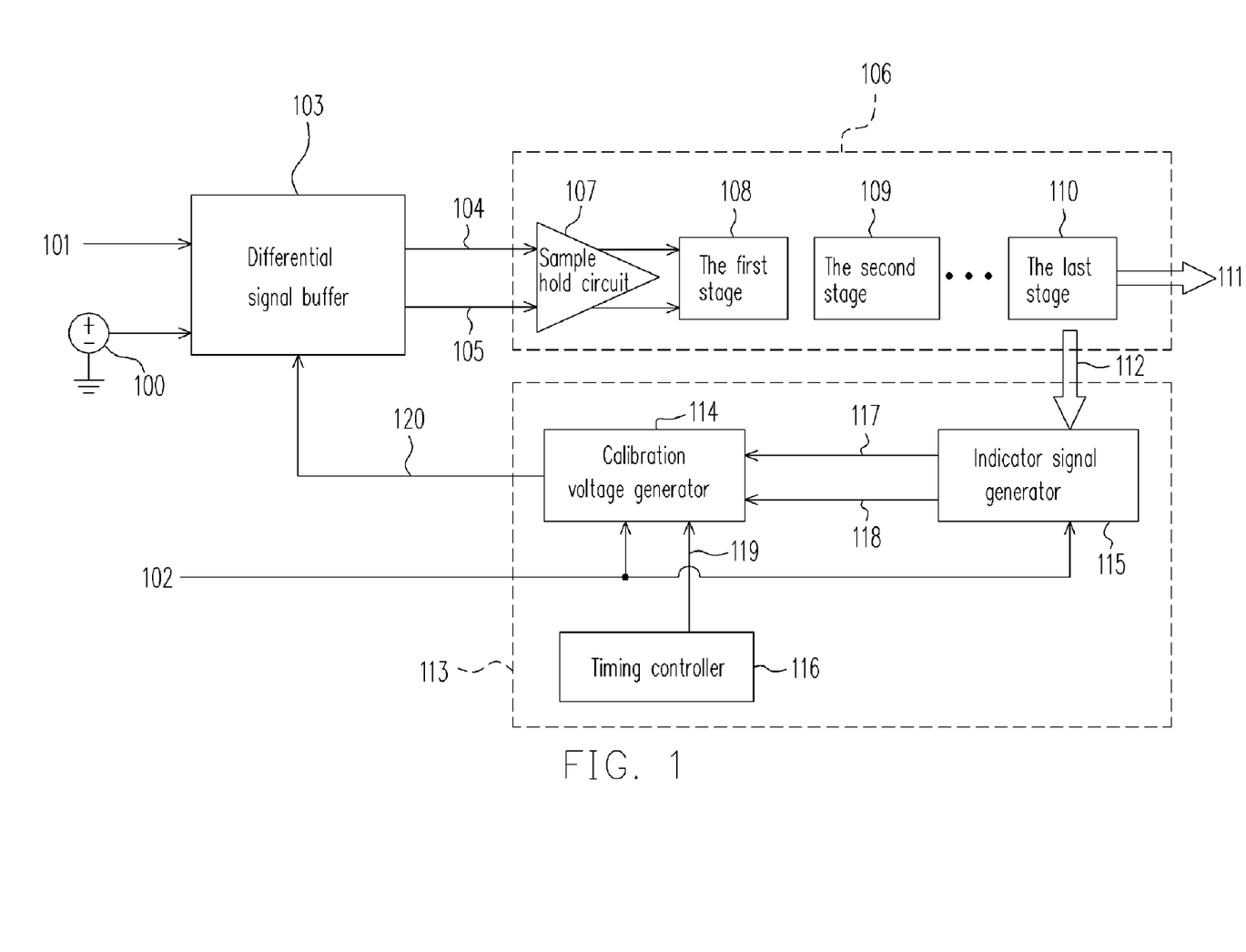
FIG. 1 is a block diagram showing the configuration of an analog-to-digital converter for video signals containing the circuit for zero offset auto-calibration according to an embodiment of the present invention.

FIG. 1 is a block diagram showing the configuration of an analog-to-digital converter for video signals which mainly includes the differential signal buffer 103, the pipeline analog-to-digital converter (pipeline ADC) 106 and an embodiment of the circuit 113 for zero offset auto-calibration provided by the present invention. Herein, the differential signal buffer 103 is served for receiving the DC voltage 100, the analog image signal 101 and the calibration voltage 120, providing the buffers and outputting the differential signal 104 and 105 to the sample/hold circuit 107 of the pipeline ADC 106. And, the pipeline ADC 106 is served for receiving the differential signal 104 and 105, feeding the signals into the sample/hold circuit 107, then processing the signals in stages, from the first stage 108, via the second stage, until the last stage 110 with the mode of a flash converter, to finally convert the differential signal 104 and 105 into the digital image signal 111 for output.

As to the block 113 representing an embodiment of the circuit for zero offset auto-calibration provided by the present invention, it includes mainly an indicator signal generator 115, a calibration voltage generator 114 and a timing controller 116. Wherein, the signal generator 115 is connected between the last stage of the pipeline ADC 110 and the calibration voltage generator 114, receives a clamp signal 102 and, in response to the output 112 from the comparator array (will be described later) of the last stage 110 when the clamp signal 102 takes a high logic voltage, outputs an indicator signal to indicate whether the output from the pipeline ADC 106, i.e. the digital image signal 111, is too high or too low for pointing out a direction for zero offset compensation. In fact, the above-mentioned indicator signal in this embodiment comprises two signals: a non-zero signal 117 and an underflow signal 118. When the non-zero signal 117 is in a high logic voltage it means that the output from the pipeline ADC 106 is too high. When the underflow signal 118 is in a low logic voltage, it means that the output from the pipeline ADC 106 is too low.

The another component, calibration voltage generator 114, is connected with the signal generator 115, the timing controller 116 and the differential signal buffer 103. The calibration voltage generator 114 is served for outputting the calibration voltage 120 to the differential signal buffer 103, and during the calibration period when both of the delay signal 119 (will be described later) and the clamp signal 102 take a high logic voltage, in response to the compensation direction shown by both of the non-zero signal 117 and the underflow signal 118, adjusting the calibration voltage 120, therewith affecting the differential signal 104 and 105 outputted from the differential signal buffer and consequently compensating the zero offset of the pipeline ADC.

The final component, the timing controller 1116, is connected with the calibration voltage generator 114 and serves for dividing the frequency of the clock signal (not shown in the figure) of the pipeline ADC converter 106 to generate and output a delay signal 119 to control the length of the calibration period so that the compensation speed of the pipeline ADC 106 is less than its converting delay speed and the converting process is stabilized.

Figure 2:
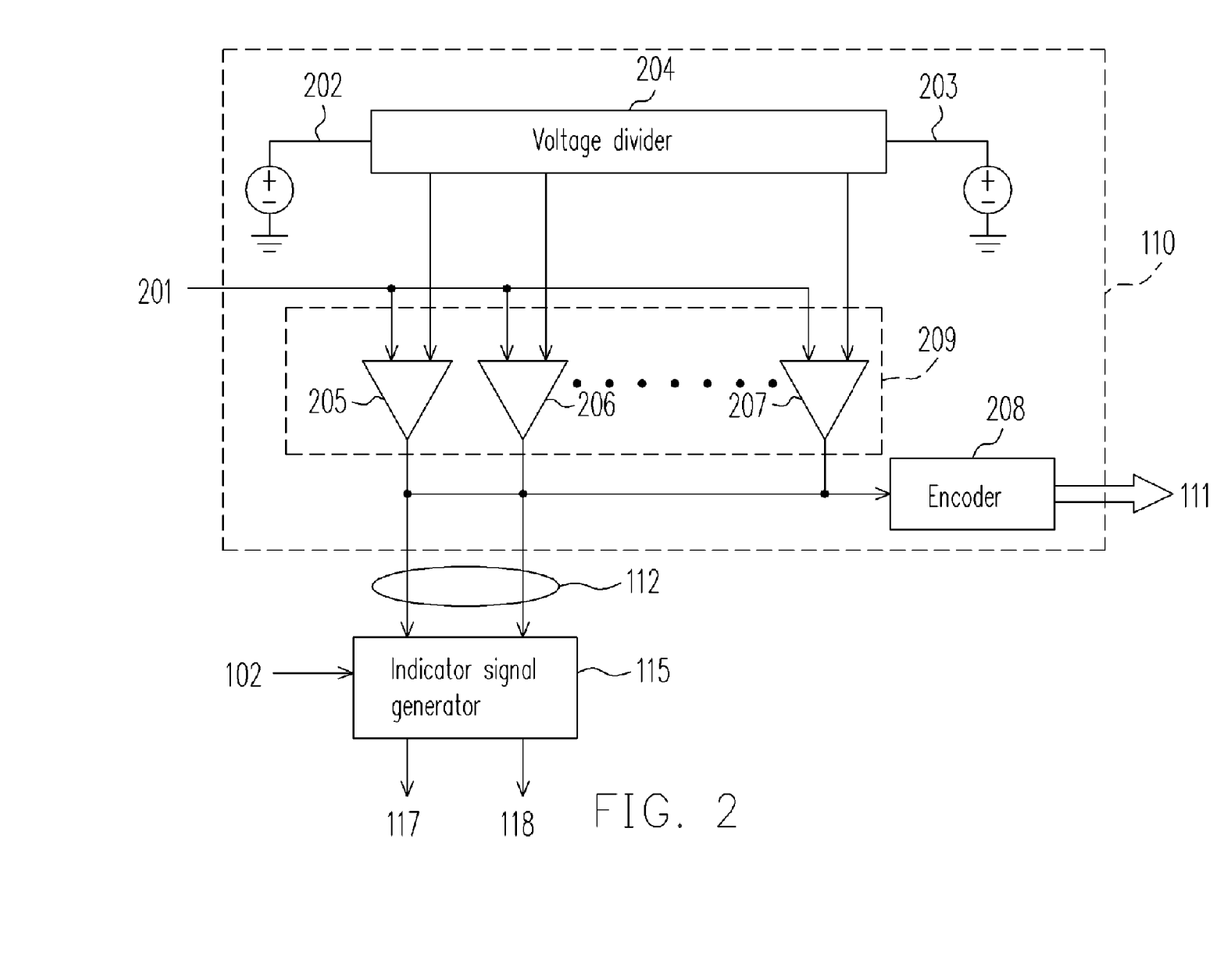
FIG. 2 is a schematic diagram showing how an indicator signal is generated by the circuit for zero offset auto-calibration according to an embodiment of the present invention.

FIG. 2 is a schematic diagram explaining how an indicator signal, i.e. the non-zero signal 117 and the underflow signal 118, is generated. First of all, there is a voltage divider circuit 204 in the last stage 110 of the pipeline ADC 106. By the circuit the voltage range between the bottom reference voltage 202 and the top reference voltage 203 is equally divided into a plurality of intermediate voltages. Then, as shown in FIG. 2, the comparators within the comparator array 209 will compare each of the intermediate voltages, including the bottom reference voltage 202 and the top reference voltage 203, with the input voltage 201 of the last stage 110 (i.e. the output voltage from the previous stage) respectively and output the result of the comparison. Noticeably, in FIG. 2 only the first comparator 205, the second comparator 206 and the last comparator 207 are illustrated, in fact the actual quantity of comparators is determined by the resolution of the last stage 110. Moreover, in this embodiment the comparator will output a high logic voltage when the input voltage 201 of the last stage 110 is higher than or equal to the corresponding intermediate voltage, otherwise a low logic voltage output will be outputted. As a matter of fact, the point is to identify the level relationship between the input 201 of the last stage and each of the intermediate voltages, so any feasible circuit scheme can be used to achieve the above purpose, not limited to the comparators in this embodiment.

The comparison results outputted from the comparator array 209, after an encoding process by the encoder 208, become the digital image signals 111 outputted from the pipeline ADC 106. But what is needed in this embodiment is the output 112 from comparator array prior to the encoding. In this embodiment, the indicator signal generator 115 give all possible combinations of outputs from the comparator 205 and the comparator 206, both of which are nearest to the bottom reference voltage 202, in the comparator array 209 a mapping onto the four binary numbers from 0 to 3. The mapping is a one-to-one relationship. The bigger the binary number, the higher the corresponding input voltage 201 of the last stage. The indicator signal generator 115 will output a non-zero signal 117 in a high logic voltage indicating that the output of the pipeline ADC 106, i.e. the digital image signal 111 is too high when the combination of outputs from the comparator 205 and the comparator 206 corresponds to 3. And when the combination of outputs from the comparator 205 and the comparator 206 corresponds to 0, a underflow signal 118 in a low logic voltage is outputted to indicate that the digital image signal 111 is too low. The criteria for compensation strategy is, when the input voltage 201 of the last stage falls in a voltage scope between two intermediate voltages corresponding to the comparator 205 and 206 respectively, it is interpreted as that no zero offset exists and no compensation is needed. When the input voltage 201 of the last stage is less than the intermediate voltage of the comparator 205, it means the calibration voltage needs to be increased. And contrarily, when the input voltage 201 of the last stage is higher than or equal to the intermediate voltage of the comparator 205, it means the calibration voltage needs to be reduced. Note that the intermediate voltage of the comparator 205 here could be the bottom reference voltage 202 as well.

The above-described configuration and operation process can be modified and extended for more flexibility. As the most common variation, the all possible combinations of outputs from the X comparators nearest the bottom reference voltage 202 in the comparator array 209 are mapped onto 2× binary numbers respectively. The mapping is a one-to-one relationship. When a combination of outputs from the comparators corresponds to one of the Y biggest binary numbers, a non-zero signal 117 in a high logic voltage is outputted. Contrarily, when a combination of outputs from the comparators corresponds to one of the Z smallest binary numbers, an underflow signal 118 in a low logic voltage is outputted. Here both of Y and Z are positive integers, and Y+Z<2×. In comparison with the above-described working scheme, it can be easily deduced that X is equal to 2 and both of Y and Z are 1 for the above-described scheme.

Figure 3:
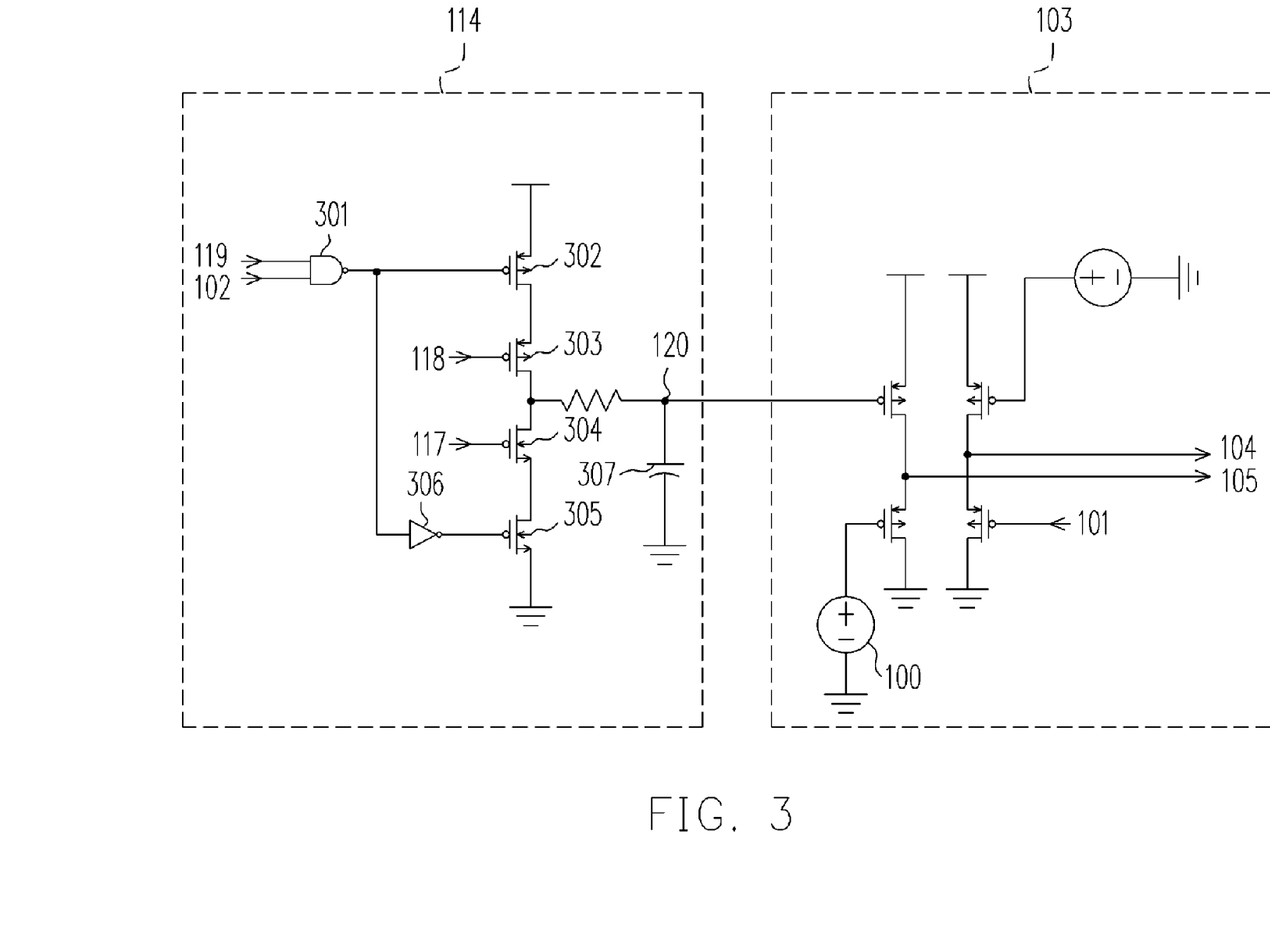
FIG. 3 is a schematic diagram showing the circuit of the calibration voltage generator of the circuit for zero offset auto-calibration according to an embodiment of the present invention.

FIG. 3 is a detailed drawing of the circuit of the calibration voltage generator 114 in this embodiment. As shown in FIG. 3, the capacitor 307 serves for holding the calibration voltage 120 which is supposed to be inputted to the differential signal buffer 103. When both of the delay signal 119 and the clamp signal 102 are in a high logic voltage, the metal oxide semiconductor field effect transistor (MOSFET) 302 and 305 are turned on by means of the AND gate 301 and the inverter 306. At this moment, if the non-zero signal 117 is in a high logic voltage, the MOSFET 304 will be turned on so that the discharging path for the capacitor 307 is opened to reduce the calibration voltage 120. If the underflow signal 118 is in a low logic voltage, the MOSFET 303 will be turned on so that the charging path for the capacitor 307 is opened to increase the calibration voltage 120. Thus it can be seen that the calibration voltage generator 114 can regulate the calibration voltage 120 only during the calibration period when the delay signal 119 and the clamp signal 102 are both in a high logic voltage. By changing the calibration voltage 120, the differential signals 104 and 105 outputted from the differential signal buffer 103 are accordingly affected, consequently the zero offset of the pipeline ADC 106 is compensated.

In general terms, in this embodiment the clamp signal 102 serves for controlling the time of the calibration period, and the delay signal 119 serves for controlling the length of the calibration period. Because the time for compensation relates to the delay from the time for sampling with the sample/hold circuit 107 to the time at witch the converting result from the pipeline ADC 106 is finished, the compensation can be done at the intervals between sampling. It is unnecessary to perform the compensation for every data. As the clamp signal 102 is in a high logic voltage the analog image signal 101 provided to the differential signal buffer 103 should be a blanking signal. Theoretically, at this time, the digital image signal 111 outputted from the pipeline ADC 106 should keep in zero voltage, and it is desirable to conduct the compensation at this moment. Herein the indicator signal generator 115 outputs an effective non-zero signal 117 and an effective underflow signal 118. Only at this time the calibration voltage generator 114 can regulate the calibration voltage 120. As the clamp signal 102 is in a low logic voltage, the analog image signal 101 provided to the differential signal buffer 103 is a general image signal, and it is nothing to do with the zero offset compensation. Thus it can be seen that the process for compensation of the zero offset and the process dealing with the general image signals, in terms of time duration, appear interlaced without mutual interference.

Figure 4:
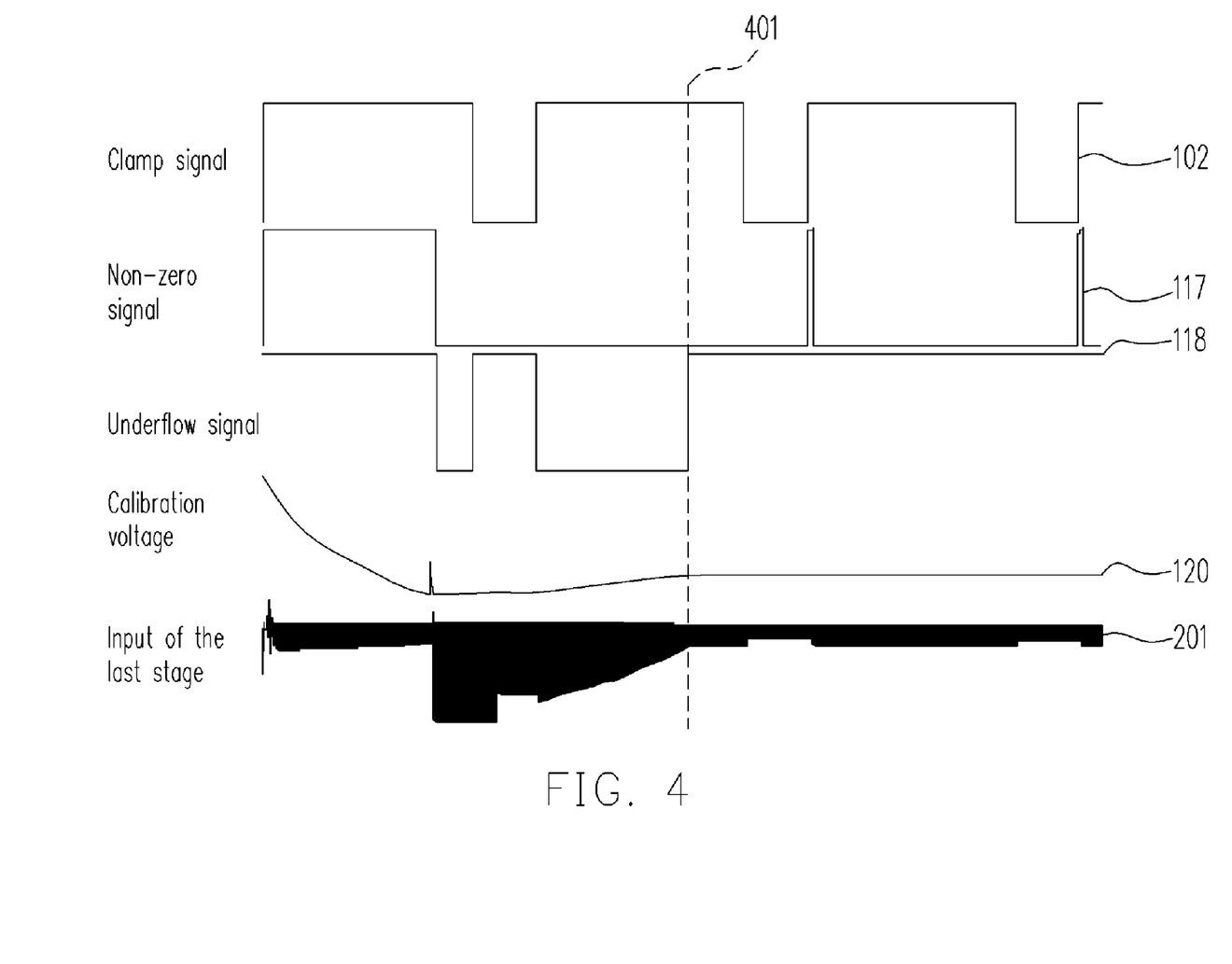
FIG. 4 is timing charts of the relevant signals during the process of zero offset auto-calibration on the circuit for zero offset auto-calibration according to an embodiment of the present invention.

FIG. 4 is a timing chart of the relevant signals during the process of zero offset auto-calibration in this embodiment. Because the delay signal 119 and the clamp signal 102 are identical in the embodiment, the calibration period here is just the duration time when the clamp signal in a high logic voltage. At this time, if the non-zero signal 117 is in a high logic voltage, the calibration voltage 120 will be reduced due to a discharging of the capacitor 307. Contrarily, if the underflow signal 118 is in a low logic voltage, the calibration voltage 120 will be increased due to a charging of the capacitor 307. By such the regulation of calibration voltage, the input to the last stage 201 gets a correction. As a result shown in FIG. 4, after the time denoted in the dot line 401 the input of the last stage 201 finishes the zero offset auto-calibration by means of a regulation of the calibration voltage 120.

In addition to the circuit, the present invention provides a method for zero offset auto-calibration as well. An embodiment is taken as example in the following to explain the method.

Figure 5:
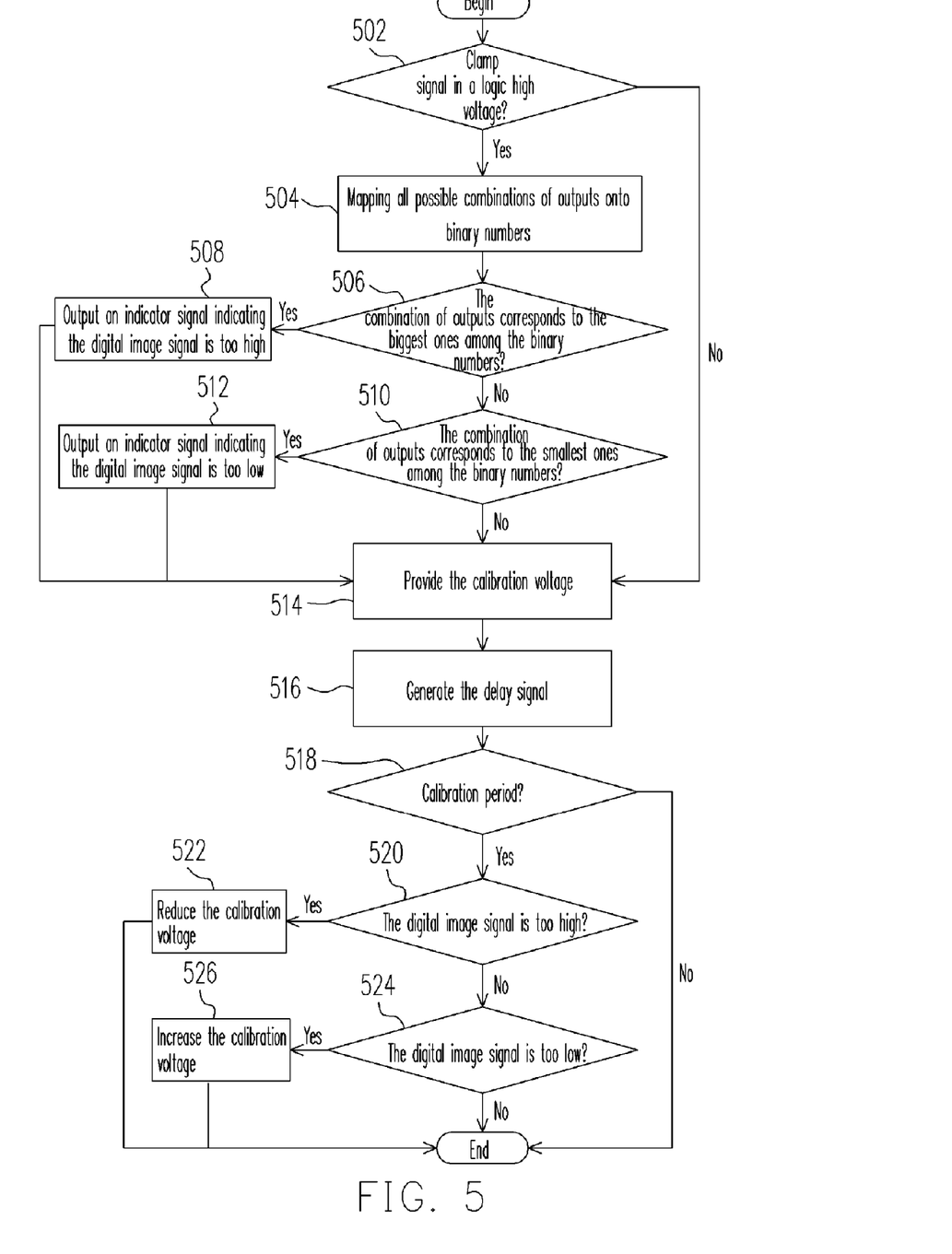
FIG. 5 is a flow chart of the method for zero offset auto-calibration according to an embodiment of the present invention.

This embodiment is applied to the circuit of the previous embodiment. FIG. 6 is the flow chart of the method according to this embodiment. In the beginning, the step 502 makes a judgment on whether the clamp signal 102 is in a high logic voltage. If not, it means the present time is not a calibration period, so the flow will skip over the process for outputting the indicator signal and directly go into the step 514 to provide the calibration voltage 120. Contrarily, if the clamp signal 102 is in a high logic voltage, the step 504 will map all possible combinations of outputs from the comparators 205 and 206 onto the binary numbers from 0 to 3. The bigger the binary number, the higher the corresponding input to the last stage 201. Then, the step 506 makes a judgment on whether the output combination from the comparators 205 and 206 corresponds to the biggest one among the four binary numbers. If yes, the step 508 will output an indicator signal indicating that the digital image signal 111 is too high, i.e., assign a high logic voltage to the non-zero signal 117. Otherwise, the step 510 makes a judgment on whether the output combination from the comparators 205 and 206 corresponds to the smallest one among the binary numbers. If yes, the step 512 will output an indicator signal indicating that the digital image signal 111 is too low, i.e., assign a low logic voltage to the underflow signal 118. Otherwise, without outputting an indicator signal, it goes into the step 514 that provides the differential signal buffer 103 with the calibration voltage 120.

Same as the previous embodiment, the above-described flow to provide the indicator signal can be modified, that is to employ more comparators and to map their combinations of outputs onto more binary numbers. Here only a simpler configuration is introduced in this embodiment.

Next, the step 516 is served for dividing the frequency of the clock signal of the pipeline ADC converter 106 to generate a delay signal 119. The following step 518 makes a judgment on whether the present time is a calibration period, i.e., whether both of the delay signal 119 and the clamp signal 102 are in a high logic voltage. If not, the regulation of the calibration voltage 120 is not needed, and the flow of the embodiment ends here.

If the present time is judged as the calibration period by the step 518, the step 520 will further make a judgment on whether the digital image signal 111 is indicated as too high, i.e., whether the non-zero signal 117 is in a high logic voltage. If yes, the step 522 reduces the calibration voltage 120, otherwise the step 524 will make a judgment on whether the digital image signal 111 is too low, i.e., whether the underflow signal 118 is in low logic voltage. If yes, the step 526 increases the calibration voltage 120. Otherwise, the flow of this embodiment ends here without a regulation of the calibration voltage 120.

As described in the preferred embodiments of the present invention, the invention adopts a simple logic circuit (the indicator signal generator 115) to generate the indicator signal to point out the compensation direction via simple operation steps, utilizes a simple charging/discharging circuit (the calibration voltage generator 114) to maintain and adjust the calibration voltage, and employs a simple timing control circuit (the timing controller 116) to control the calibration period. By such means, the present invention eliminates the digital-to-analog converter and the register adopted by the prior art, and therefore simplifies the circuit layout and saves the circuit area.

It will be apparent to those skilled in the art that various modifications and variations can be made to the structure of the present invention without departing from the scope or spirit of the invention. In view of the foregoing, it is intended that the specification and examples to be considered as exemplary only, with a true scope and spirit of the invention being indicated by the following claims and their equivalents.

What is claimed is:

1. A circuit for zero offset auto-calibration, connected between a last stage of a pipeline analog-to-digital converter (pipeline ADC) and a differential signal buffer, comprising:
   an indicator signal generator, connected with said last stage, in response to the output from a comparator array contained in said last stage outputting an indicator signal to indicate whether the output from said pipeline ADC is too high or too low;
   a calibration voltage generator, connected between said indicator signal generator and said differential signal buffer, outputting an calibration voltage to said differential signal buffer and in response to said indicator signal regulating said calibration voltage within a calibration period decided by a delay signal; and
   a timing controller, connected with said calibration voltage generator, outputting said delay signal to control the length of said calibration period so that the compensation speed of said pipeline ADC less than the converting delay speed of said pipeline ADC.

2. The circuit for zero offset auto-calibration of claim 1, wherein said indicator signal includes a non-zero signal and an underflow signal, and said output from said pipeline ADC is too high when said non-zero signal is at a high logic voltage, said output from said pipeline ADC is too low when said underflow signal is at a low logic voltage.

3. The circuit for zero offset auto-calibration of claim 1, wherein said indicator signal generator generates and outputs said indicator signal in response to the outputs from X comparators of said comparator array nearest to a bottom reference voltage, wherein X is a positive integer greater than or equal to 2.

4. The circuit for zero offset auto-calibration of claim 3, wherein said indicator signal generator maps all possible combinations of the outputs of said comparators onto 2× binary numbers, said mapping is a one-to-one relationship, and the bigger said binary number, the higher the corresponding input voltage of said last stage, said indicator signal generator outputs said indicator signal indicating that the output from said pipeline ADC is too high when the combination of the outputs from said comparators corresponds to one of the Y biggest binary numbers of said binary numbers, and said indicator signal generator outputs an indicator signal indicating that the output from said pipeline ADC is too low when the combination of the outputs from said comparators corresponds to one of the Z smallest binary numbers of said binary numbers, wherein both of Y and Z are positive integers, and Y+Z<2×.

5. The circuit for zero offset auto-calibration of claim 4, wherein X is equal to 2, Y is equal to 1, and Z is equal to 1.

6. The circuit for zero offset auto-calibration of claim 1, wherein said indicator signal generator receives also a clamp signal and outputs said indicator signal only when said clamp signal is at a high logic voltage.

7. The circuit for zero offset auto-calibration of claim 1, wherein said calibration voltage generator receives also a clamp signal and said calibration period is determined by said delay signal and said clamp signal.

8. The circuit for zero offset auto-calibration of claim 7, wherein said calibration period is the period when both of said delay signal and said clamp signal are at a logic high voltage.

9. The circuit for zero offset auto-calibration of claim 1, wherein said calibration voltage generator reduces said calibration voltage when said indicator signal indicates that the output from said pipeline ADC is too high, and increases said calibration voltage when said indicator signal indicates that the output from said pipeline ADC is too low.

10. The circuit for zero offset auto-calibration of claim 1, wherein said timing controller generates said delay signal by dividing the frequency of a clock signal of said pipeline ADC converter.

11. A method for zero offset auto-calibration, suitable for an analog-to-digital converter (ADC) circuit for video signals, said ADC circuit includes a pipeline ADC and a differential signal buffer, said method comprises the following steps:
according to the output from a comparator array contained in the last stage of said pipeline ADC generating an indicator signal to indicate whether the output from said pipeline ADC is too high or too low; and
providing a calibration voltage to said differential signal buffer, and regulating said calibration voltage according to said indicator signal in a calibration period determined by a delay signal, wherein said delay signal controls the length of said calibration period so that the compensation speed of said pipeline ADC is less than the converting delay speed of said pipeline ADC.

12. The method for zero offset auto-calibration of claim 11, wherein said indicator signal includes a non-zero signal and a underflow signal, and if said non-zero signal is in a high logic voltage, the output from said pipeline ADC is too high, if said underflow signal is in a low logic voltage, the output from said pipeline ADC is too low.

13. The method for zero offset auto-calibration of claim 11, wherein the step of generating said indicator signal further comprises:
according to the outputs from X of comparators of said comparator array nearest to a bottom reference voltage, generating said indicator signal, wherein X is a positive integer greater than or equal to 2.

14. The method for zero offset auto-calibration of claim 13, wherein the step of generating said indicator signal according to the outputs from said comparators further comprises:
mapping all possible combinations of the outputs of said comparators onto 2× binary numbers, said mapping is a one-to-one relationship, and the bigger said binary number, the higher the corresponding input voltage of said last stage;
outputting said indicator signal to indicate the output from said pipeline ADC is too high when the combination of the outputs from said comparators corresponds to one of the Y biggest binary numbers of said binary numbers; and
outputting said indicator signal to indicate the output from said pipeline ADC is too low when the combination of the outputs from said comparators corresponds to one of the Z smallest binary numbers of said binary numbers, wherein both of Y and Z are positive integers, and Y+Z<2×.

15. The method for zero offset auto-calibration of claim 14, wherein X is equal to 2, Y is equal to 1, and Z is equal to 1.

16. The method for zero offset auto-calibration of claim 11, wherein said indicator signal is generated only when a clamp signal is in a high logic voltage.

17. The method for zero offset auto-calibration of claim 11, wherein said calibration period is determined by said delay signal and a clamp signal.

18. The method for zero offset auto-calibration of claim 17, wherein said calibration period is the period when both of said delay signal and said clamp signal are in a high logic voltage.

19. The method for zero offset auto-calibration of claim 11, wherein the step of providing and regulating said calibration voltage further include:
reducing said calibration voltage when said indicator signal indicates that the output from said pipeline ADC is too high; and
increasing said calibration voltage when said indicator signal indicates that the output from said pipeline ADC is too low.

20. The method for zero offset auto-calibration of claim 11, wherein said delay signal is generated by dividing the frequency of a clock signal of said pipeline ADC.

* * * * *